(12) United States Patent
Nagata et al.

(10) Patent No.: US 6,815,792 B2
(45) Date of Patent: Nov. 9, 2004

(54) EPITAXIALLY GROWN COMPOUND SEMICONDUCTOR FILM AND COMPOUND SEMICONDUCTOR MULTI-LAYER STRUCTURE

(75) Inventors: Hisao Nagata, Osaka (JP); Yasunori Arima, Osaka (JP); Nobuyuki Komaba, Osaka (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 6 days.

(21) Appl. No.: 10/401,215

(22) Filed: Mar. 27, 2003

(65) Prior Publication Data

US 2003/0183896 A1 Oct. 2, 2003

(30) Foreign Application Priority Data

Mar. 28, 2002  (JP) ........................................ 2002-091313

(51) Int. Cl.⁷ ........................ H01L 27/14; H01L 29/167
(52) U.S. Cl. ........................ 257/461; 257/431; 257/462; 257/466; 257/607; 257/617; 438/48; 438/81; 438/87
(58) Field of Search ........................ 257/431, 461–466, 257/607, 609, 611, 617; 438/48, 54, 69, 81, 87

(56) References Cited

U.S. PATENT DOCUMENTS

| | | | | |
|---|---|---|---|---|
| 4,481,523 A | * | 11/1984 | Osaka et al. | ................. 257/186 |
| 5,332,919 A | * | 7/1994 | Fujimura | ..................... 257/434 |

* cited by examiner

Primary Examiner—Donghee Kang
(74) Attorney, Agent, or Firm—RatnerPrestia

(57) ABSTRACT

The present invention provides an epitaxially grown compound semiconductor film having a low density of crystal defects which are generated during the course of crystal growth of a compound semiconductor. The present invention also provides a compound semiconductor multi-layer structure including an n-type InP substrate, an n-type InP buffer layer, an undoped InGaAs light-absorbing layer, and an n-type InP cap layer, the layers being successively grown on the substrate through MOCVD. In the InGaAs layer, the compositional ratio of In/Ga is cyclically varied in a thickness direction (cyclic intervals: 80 nm) so as to fall within a range of ±2% with respect to a predetermined compositional ratio that establishes lattice matching between InGaAs and InP; specifically, within a range between 0.54/0.46 (i.e., $In_{0.54}Ga_{0.46}As$) and 0.52/0.48 (i.e., $In_{0.52}Ga_{0.48}As$)

6 Claims, 3 Drawing Sheets

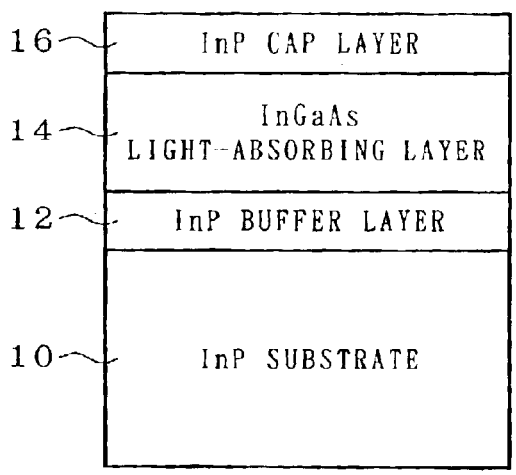
F I G . 1
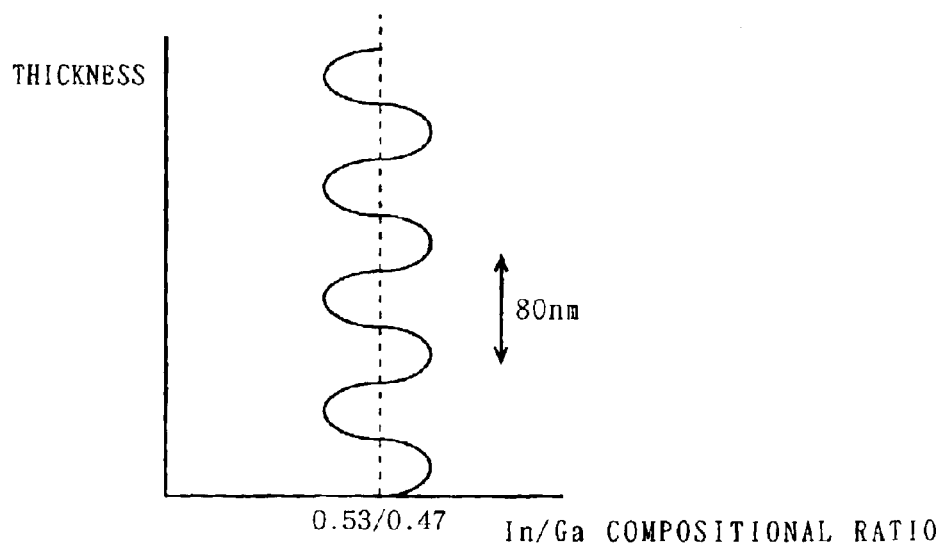
F I G . 2

EPITAXIALLY GROWN COMPOUND SEMICONDUCTOR FILM AND COMPOUND SEMICONDUCTOR MULTI-LAYER STRUCTURE

BACKGROUND OF THE INVENTION

1. Field of the Invention

The present invention relates to an epitaxially grown compound semiconductor film, and more particularly to an epitaxially grown compound semiconductor film of reduced crystal defect density. The invention also relates to a compound semiconductor multi-layer structure including the epitaxially grown compound semiconductor film. The invention further relates to a light-receiving device including the compound semiconductor multi-layer structure.

2. Description of the Prior Art

When an epitaxially grown semiconductor film containing crystal defects is employed in a device, reliability of the device is adversely affected. Therefore, demand has arisen for an epitaxially grown compound semiconductor film of reduced crystal defect density.

In general, compound semiconductor single-crystal substrates contain crystal defects. In order to grow a compound semiconductor multi-layer film on such a defect-containing compound semiconductor single-crystal substrate, when the substrate is brought into a crystal growth apparatus, the substrate is subjected to surface treatment. However, difficulty is encountered in completely removing defects present in the surface of the substrate, an oxidized layer formed on the surface, or impurities deposited or adsorbed onto the surface.

Therefore, in a conventional process, a buffer layer having a thickness of about 1 μm is formed on a compound semiconductor single-crystal substrate, and subsequently a compound semiconductor multi-layer film is formed on the buffer layer. The buffer layer can lower the adverse effect of, for example, defects in the surface of the substrate on the multi-layer film. Also, the buffer layer reduces propagation of lattice defects contained in the substrate.

When a film of a compound semiconductor whose lattice constant varies with its compositional proportions is formed, regulation of the compositional proportions is a critical factor for determining the quality of the film. Particularly when a thick compound semiconductor film is formed, characteristics of the film are greatly affected by the difference in lattice constant between the film and a substrate, for the following reason. Since the thickness of the film is considerably smaller than that of the substrate, the difference in lattice constant between the film and the substrate causes generation of strain in the film. In order to prevent generation of such strain, in some cases, a buffer layer is formed on the substrate from the same material as the substrate, and then a film of intended structure is formed on the buffer layer.

Propagation of defects in a film grown on a substrate, the defects being generated by propagation of defects in the substrate, is prevented at, for example, the interface between layers formed of different semiconductor materials. This is because, when a film is grown on a substrate or an underlying layer such that the crystal structure of the substrate or underlying layer is reflected on the film, the thus-grown film exhibits microstructural discontinuity at the interface between layers formed of different semiconductor materials. In order to utilize such a phenomenon, in some cases, a buffer layer of superlattice structure is provided. The term "superlattice structure" refers to a structure in which layers formed of at least two different materials are alternately laminated, and in many cases, the thicknesses of the layers are determined to be 20 nm or less.

As described above, various techniques which have heretofore been proposed for preventing generation of defects in a semiconductor film are not fully satisfactory, and depending on the device to which the film is incorporated, the structure of the device prevents employment of such techniques.

As described above, propagation of defects is prevented at the interface between layers formed of different semiconductor materials. However, in some cases, because of microstructural discontinuity at the interface, defects are newly generated at the interface.

Devices incorporating an epitaxially grown semiconductor film include a light-receiving device employed for optical communication. For example, a light-receiving device sensitive to light having a wavelength of 1.3 μm or 1.55 μm, which is generally employed for optical communication, has a structure including an InP substrate, and an InGaAs light-absorbing layer formed on the substrate. When reverse bias is applied to the light-receiving device in the absence of light, dark current flows through the device. The value of dark current varies in accordance with the structure of the light-receiving device, strain in the InGaAs layer, and the defect density of the layer. In order to reduce strain or defects in the InGaAs layer, when, for example, a conventional superlattice-structure layer is employed, a radical modification must be effected to the structure of the device. However, modification of the device structure causes variation in characteristics of the device, and therefore such modification is desirably avoided.

SUMMARY OF THE INVENTION

In view of the foregoing, an object of the present invention is to reduce the density of crystal defects in a compound semiconductor film, which defects are generated during the course of epitaxial growth of the film or in a process for producing a device, to thereby improve characteristics of the device including the epitaxially grown semiconductor film.

Another object of the present invention is to provide an epitaxially grown compound semiconductor film of reduced defect density.

Still another object of the present invention is to provide a compound semiconductor multi-layer structure comprising the epitaxially grown compound semiconductor film.

Yet another object of the present invention is to provide a light-receiving device comprising the compound semiconductor multi-layer structure.

According to a first aspect of the present invention, there is provided an epitaxially grown compound semiconductor film, wherein the compositional proportions of a compound semiconductor constituting the film cyclically vary in a thickness direction. Preferably, the profile of the cyclic variation of the compositional proportions in a thickness direction assumes the form of a sinusoid.

According to a second aspect of the present invention, there is provided a compound semiconductor multi-layer structure comprising such an epitaxially grown film. One embodiment of the compound semiconductor multi-layer structure is a multi-layer structure comprising a compound semiconductor substrate; a compound semiconductor buffer layer formed on the compound semiconductor substrate, the buffer layer being of the same conduction type as the compound semiconductor substrate; an undoped compound semiconductor light-absorbing layer formed on the compound semiconductor buffer layer; and a compound semiconductor cap layer formed on the compound semiconductor light-absorbing layer, the cap layer being of the same conduction type as the compound semiconductor substrate, wherein the compositional proportions of a compound semiconductor constituting the compound semiconductor light-absorbing layer cyclically vary in a thickness direction with respect to predetermined compositional proportions that establish lattice matching between the compound semiconductor and a compound semiconductor constituting the compound semiconductor substrate.

Another embodiment of the compound semiconductor multi-layer structure is a multi-layer structure comprising an InP substrate; an InP buffer layer formed on the InP substrate, the buffer layer being of the same conduction type as the InP substrate; an undoped InGaAs light-absorbing layer formed on the InP buffer layer; and an InP cap layer formed on the InGaAs light-absorbing layer, the cap layer being of the same conduction type as the InP substrate, wherein the compositional ratio between In and Ga which constitute the InGaAs light-absorbing layer cyclically varies in a thickness direction with respect to a predetermined compositional ratio that establishes lattice matching between InGaAs and InP constituting the substrate.

According to a third aspect of the present invention, there is provided a light-receiving device comprising such a compound semiconductor multi-layer structure. One embodiment of the light-receiving device is a light-receiving device comprising an n-type InP substrate; an n-type InP buffer layer formed on the InP substrate; an undoped InGaAs light-absorbing layer formed on the InP buffer layer; an n-type InP cap layer formed on the InGaAs light-absorbing layer; a Zn diffusion region formed in at least the InP cap layer; a p-type electrode formed on the upper surface of the Zn diffusion region; and an n-type electrode formed on the bottom surface of the InP substrate, wherein the compositional ratio between In and Ga which constitute the InGaAs light-absorbing layer cyclically varies in a thickness direction with respect to a predetermined compositional ratio that establishes lattice matching between InGaAs and InP constituting the substrate.

BRIEF DESCRIPTION OF THE DRAWINGS

FIG. 1 is a schematic representation showing a multi-layer structure employed for producing a pin-type light-receiving device;

FIG. 2 shows a profile of cyclic variation of In/Ga compositional ratio;

DESCRIPTION OF THE EXEMPLARY EMBODIMENT

Figure 3:
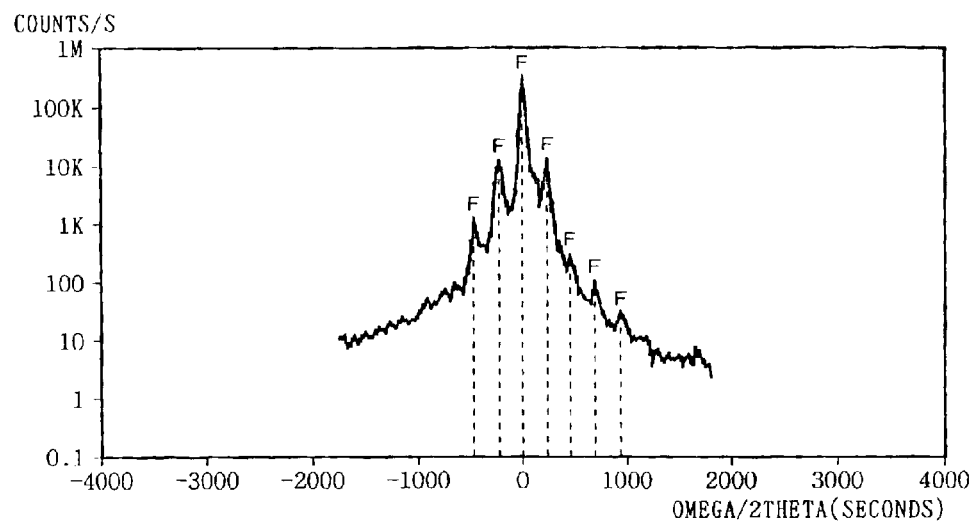
FIG. 3 shows an X-ray diffraction pattern of a formed film.

According to the present invention, when a film of a compound semiconductor whose lattice constant varies in accordance with its compositional proportions is epitaxially grown, the compositional proportions are varied in a thickness direction, to thereby create microstructural discontinuity in the film. For example, when an InGaAs film is formed on an InP substrate, the compositional ratio between In and Ga in InGaAs is varied. In general, variation of compositional proportions of a semiconductor crystal causes cyclic variation of the lattice constant of the crystal.

Thus, when the lattice constant of the crystal is cyclically varied, a structure similar to a superlattice structure is formed, and propagation of defects can be prevented. In addition, since the thus-formed structure is not in fact a superlattice, cyclic variation of bandgap does not occur in the structure. Therefore, when a device is produced from a compound semiconductor film having such a structure, a conventional device structure can be employed as is.

Thus, propagation of defects from a substrate or an underlying layer to a film grown on the substrate or underlying layer can be prevented. Also, propagation of defects from the interface between the film and the substrate or underlying layer can be prevented, as well as propagation of defects generated in the film. The present invention has been accomplished on the basis of the aforementioned technical concept and finding.

Next will be described an embodiment of the present invention; i.e., a pin-type light-receiving device sensitive to light having a wavelength of 1.3 $\mu$m or 1.55 $\mu$m, which is generally employed for optical communication.

FIG. 1 schematically shows a multi-layer structure employed for producing the pin-type light-receiving device. As shown in FIG. 1, an n-type InP buffer layer 12, an undoped InGaAs light-absorbing layer 14, and an n-type InP cap layer 16 were successively grown on an n-type InP substrate 10 through MOCVD. The present invention was applied to the InGaAs layer 14. InGaAs having an In/Ga compositional ratio of 0.53/0.47; i.e., $In_{0.53}Ga_{0.47}As$, establishes lattice matching with InP constituting the substrate 10.

In the present embodiment, the compositional ratio of In/Ga was cyclically varied in a thickness direction (cyclic intervals: 80 nm) so as to fall within a range of ±2% with respect to the aforementioned lattice matching condition; specifically, within a range between 0.54/0.46 (i.e., $In_{0.54}Ga_{0.46}As$) and 0.52/0.48 (i.e., $In_{0.52}Ga_{0.48}As$). In the present embodiment, conditions for crystal growth of the InGaAs layer 14 were determined such that the profile of the cyclic variation of the In/Ga compositional ratio in a thickness direction assumes the form of a sinusoid. FIG. 2 shows the sinusoidal profile of the cyclic variation of the In/Ga compositional ratio. In FIG. 2, the horizontal axis represents the In/Ga compositional ratio, and the vertical axis represents the thickness of the layer 14. The In/Ga compositional ratio cyclically varies with respect to 0.53/0.47 within a range between 0.52/0.48 and 0.54/0.46 such that the profile of the cyclic variation assumes the form of a sinusoid.

FIG. 3 shows an X-ray diffraction pattern of the thus-formed layer 14. As is apparent from FIG. 3, the diffraction pattern has clear satellite peaks derived from the cyclic variation in composition; i.e., the layer 14 has an intended structure. Meanwhile, the results of low-temperature photoluminescence analysis show that a quantum level corresponding to a well potential is not present in the layer 14; i.e., the layer 14 does not have a quantum well structure.

Figure 4:
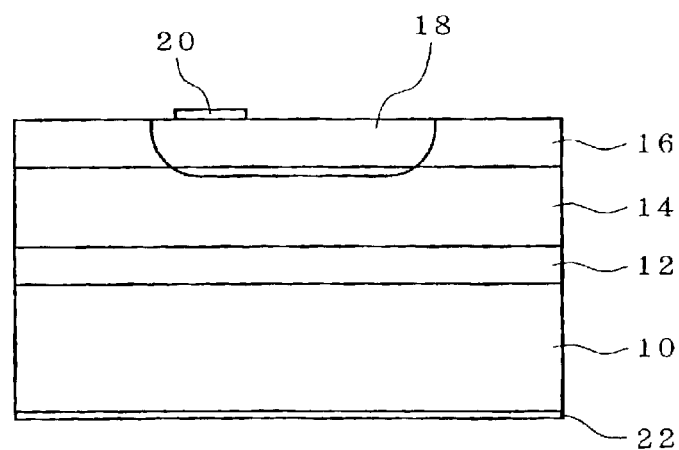
FIG. 4 is a schematic cross-sectional view showing a pin-type light-receiving device.

Subsequently, as shown in FIG. 4, a Zn diffusion region 18 was formed on the multi-layer structure of FIG. 1 by means of a Zn diffusion technique, to thereby form a pin junction. The cyclic variation in composition of the layer 14 was found to have substantially no effect on diffusion of Zn into the InP cap layer 16 (i.e., any effect falls below the detection limit). A p-type electrode 20 was formed on the Zn diffusion region 18, and an n-type electrode 22 was formed on the bottom surface of the InP substrate, to thereby produce the pin-type light-receiving device.

Figure 5:
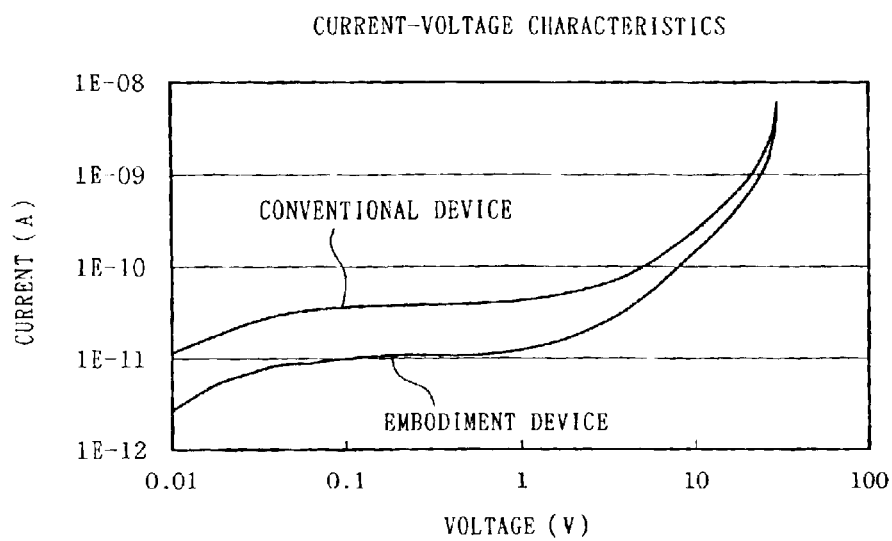
FIG. 5 is a graph showing the results of evaluation of current-voltage characteristics of pin-type light-receiving devices in the dark.

FIG. 5 shows the results of evaluation of current-voltage characteristics of the thus-produced pin-type light-receiving device in the dark. For comparison, FIG. 5 also shows the results of evaluation of a conventional pin-type light-receiving device including an InGaAs layer in which compositional proportions are not cyclically varied. The results show that the dark current of the light-receiving device incorporating the structure of the present invention is lowered to about ½ that of the conventional light-receiving device. Meanwhile, the results of measurement of photosensitivity characteristics show that the light-receiving device of the present invention exhibits no difference in photosensitivity from the conventional pin-type light-receiving device including an InGaAs layer of uniform composition.

According to the present invention, the dark current of the light-receiving device can be reduced. Conceivably, this dark current reduction is attributed to reduction of the density of defects in a semiconductor film. As a result, reliability of the device upon operation at high temperature can be improved.

When a superlattice structure is employed in a conventional device, defects in the device can be reduced as in the case of the present invention, but the device exhibits variation in bandgap. Therefore, device characteristics such as photosensitivity characteristics also vary. In contrast, according to the present invention, merely the InGaAs layer of a conventional device structure is modified such that compositional proportions of InGaAs cyclically vary, and thus the remaining portion of the device structure requires no modification. Therefore, device characteristics do not vary.

What is claimed is:

1. A compound semiconductor multi-layer structure comprising:
   a compound semiconductor substrate;
   a compound semiconductor buffer layer formed on the compound semiconductor substrate, the buffer layer being of the same conduction type as the compound semiconductor substrate;
   an undoped compound semiconductor light-absorbing layer formed on the compound semiconductor buffer layer; and
   a compound semiconductor cap layer formed on the compound semiconductor light-absorbing layer, the cap layer being of the same conduction type as the compound semiconductor substrate, wherein the compositional proportions of a compound semiconductor constituting the compound semiconductor light-absorbing layer cyclically vary in a thickness direction with respect to predetermined compositional proportions that establish lattice matching between the compound semiconductor and a compound semiconductor constituting the compound semiconductor substrate.

2. The compound semiconductor multi-layer structure of claim 1, wherein the profile of the cyclic variation of the compositional proportions in a thickness direction assumes the form of a sinusoid.

3. A compound semiconductor multi-layer structure comprising:
   an InP substrate;
   an InP buffer layer formed on the InP substrate, the buffer layer being of the same conduction type as the InP substrate;
   an undoped InGaAs light-absorbing layer formed on the InP buffer layer; and
   an InP cap layer formed on the InGaAs light-absorbing layer, the cap layer being of the same conduction type as the InP substrate, wherein the compositional ratio between In and Ga which constitute the InGaAs light-absorbing layer cyclically varies in a thickness direction with respect to a predetermined compositional ratio that establishes lattice matching between InGaAs and InP constituting the substrate.

4. The compound semiconductor multi-layer structure of claim 3, wherein the profile of the cyclic variation of the compositional ratio in a thickness direction assumes the form of a sinusoid.

5. A pin-type light-receiving device comprising:
   an n-type InP substrate;
   an n-type InP buffer layer formed on the InP substrate;
   an undoped InGaAS light-absorbing layer formed on the InP buffer layer;
   an n-type InP cap layer formed on the InGaAs light-absorbing layer;
   a Zn diffusion region formed in at least the InP cap layer;
   a p-type electrode formed on the upper surface of the Zn diffusion region; and
   an n-type electrode formed on the bottom surface of the InP substrate, wherein the compositional ratio between In and Ga which constitute the InGaAs light-absorbing layer cyclically varies a thickness direction with respect to a predetermined compositional ratio that establishes lattice matching between InGaAs and InP constituting the substrate.

6. The pin-type light-receiving device of claim 5, wherein the profile of the cyclic variation of the compositional ratio in a thickness direction assumes the form of a sinusoid.

* * * * *